(12) United States Patent
Bakalski et al.

(10) Patent No.: US 8,970,323 B2
(45) Date of Patent: Mar. 3, 2015

(54) CIRCUIT ARRANGEMENT WITH AN ANTENNA SWITCH AND A BANDSTOP FILTER AND CORRESPONDING METHOD

(75) Inventors: Winfried Bakalski, Munich (DE); Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 716 days.

(21) Appl. No.: 13/185,566

(22) Filed: Jul. 19, 2011

(65) Prior Publication Data

US 2013/0021113 A1  Jan. 24, 2013

(51) Int. Cl.
*H03H 7/12* (2006.01)
*H01P 1/15* (2006.01)
*H04B 1/18* (2006.01)

(52) U.S. Cl.
CPC .. *H04B 1/18* (2013.01); *H01P 1/15* (2013.01); *H03H 7/12* (2013.01)
USPC ............ 333/174; 333/176; 333/181; 333/262

(58) Field of Classification Search
CPC ..... H03H 7/0015; H03H 7/12; H03H 7/1775; H03H 7/175; H03H 7/0153; H01P 1/15; H04B 1/18

USPC .................. 333/174–176, 181, 262; 343/905
See application file for complete search history.

(56) References Cited

U.S. PATENT DOCUMENTS

| | | | | |
|---|---|---|---|---|
| 5,932,522 | A * | 8/1999 | Bell et al. ....................... | 505/210 |
| 6,794,957 | B2 * | 9/2004 | Shafer et al. .................. | 333/185 |
| 8,076,991 | B2 * | 12/2011 | Carmel et al. ................ | 333/17.1 |
| 8,649,137 | B2 * | 2/2014 | Senouci et al. ................. | 361/56 |
| 8,803,632 | B2 | 8/2014 | Takeuchi | |
| 2002/0019218 | A1 * | 2/2002 | Greverie et al. .............. | 455/127 |
| 2013/0194054 | A1 * | 8/2013 | Presti ............................ | 333/112 |

FOREIGN PATENT DOCUMENTS

KR  2009-0083104 A  8/2009
WO  2010053131 A1  5/2010

\* cited by examiner

*Primary Examiner* — Benny Lee
*Assistant Examiner* — Rakesh Patel

(57) ABSTRACT

Implementations are presented herein that include an antenna switch that includes a plurality of ports. A bandstop filter is coupled to at least one of the plurality of ports of the antenna switch and the bandstop filter is configured to attenuate a disturbing frequency. A transistor is configured to receive a control signal and to switch on the bandstop filter responsive to the control signal.

22 Claims, 7 Drawing Sheets

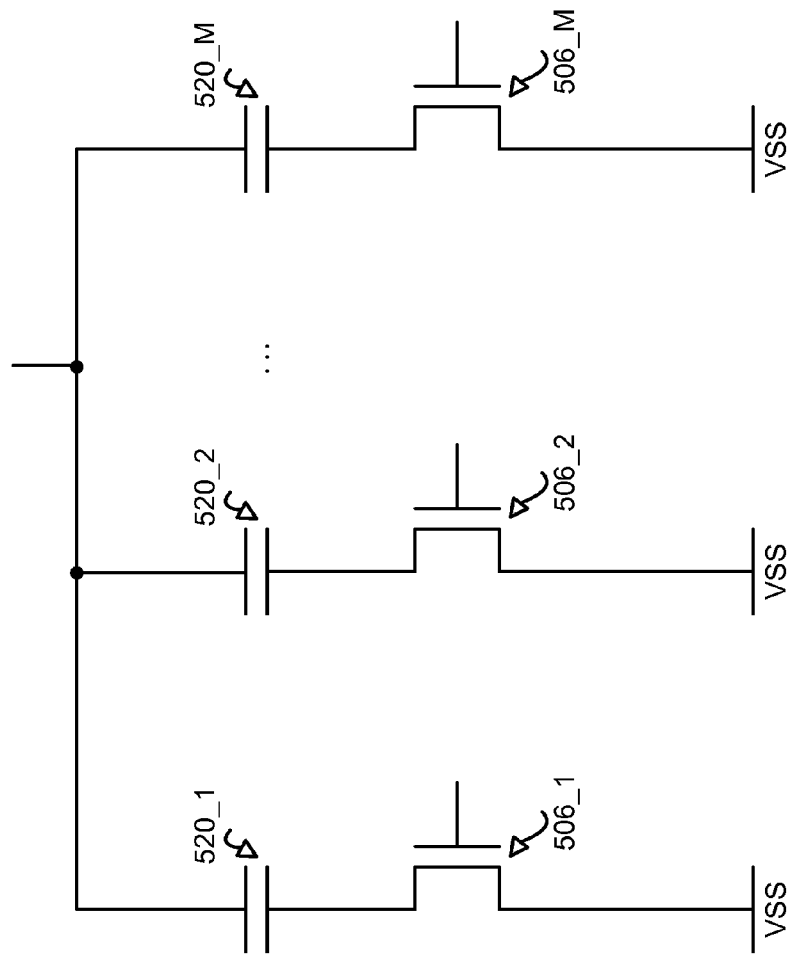
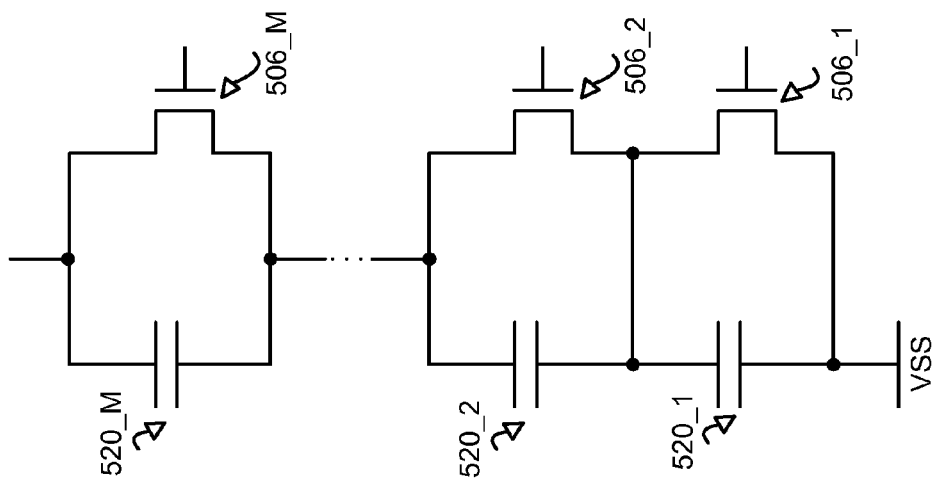
Fig.5B
Fig.5A

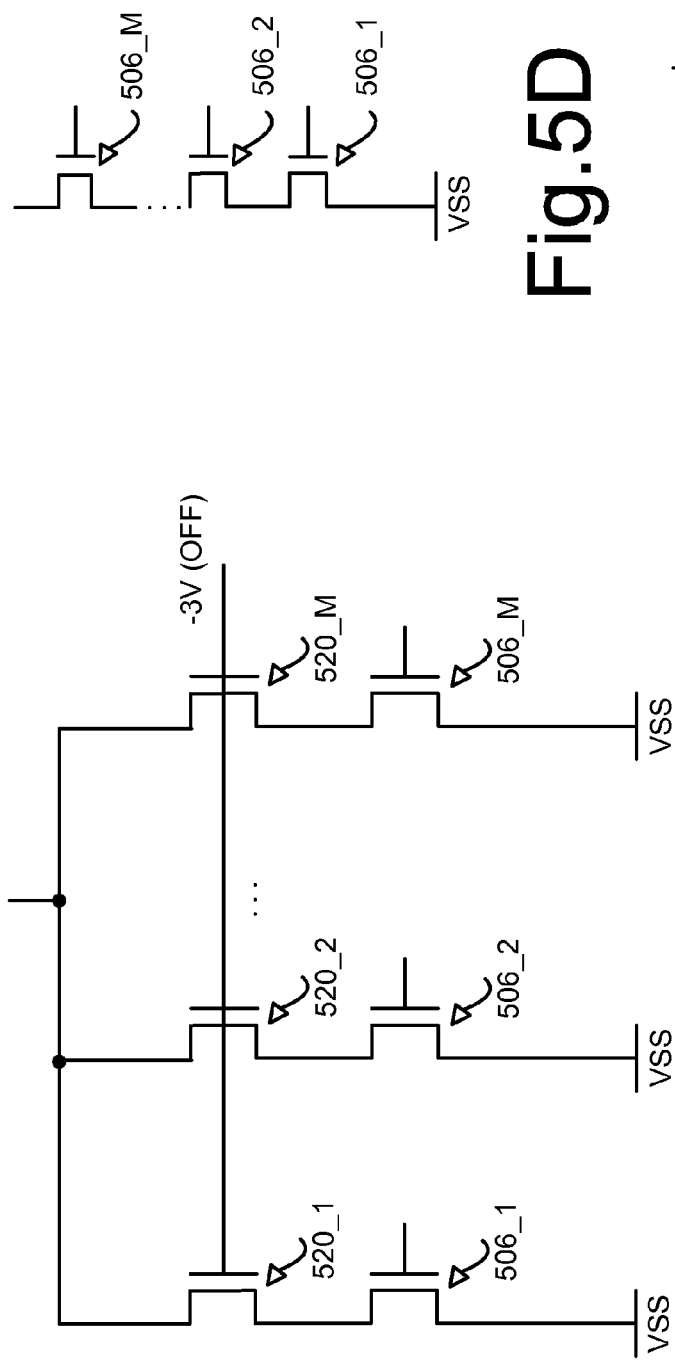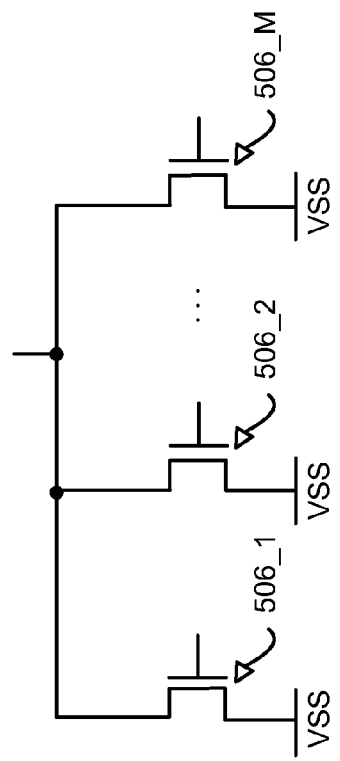

US 8,970,323 B2

CIRCUIT ARRANGEMENT WITH AN ANTENNA SWITCH AND A BANDSTOP FILTER AND CORRESPONDING METHOD

BACKGROUND

In recent years, several different wireless communication standards have been developed worldwide. For example, communication standards like (E)GSM, DCS, PCS, TDMA, (W-)CDMA or GPS are employed in different parts of the world. From a user perspective, it is desirable to have a single mobile communication device that operates under multiple or all communication standards.

A single antenna may be implemented in the single mobile communication device and the single antenna may receive and provide signals, which may be in any of multiple different frequency bands. Within the communication device, a multi-band antenna switch module may perform an interface between the single antenna and multiple receivers, transmitters and/or transceivers. Each of the receivers, transmitters and/or transceivers may be associated with a dedicated frequency band. The single antenna together with the multiband antenna switch module may allow for the design of a cost-efficient, small-sized mobile communication device that may be used in many different countries.

BRIEF DESCRIPTION OF THE DRAWINGS

The detailed description is described with reference to the accompanying figures. In the figures, the left-most digit of a reference number identifies the figure in which the reference number first appears. The use of similar reference numbers in different instances in the description and the figures may indicate similar or identical items.

FIGS. 5A-5E show schematic circuit diagrams of capacitances that may be implemented in one of the bandstop filters, as illustrated and described in connection with FIGS. 1-4.

DETAILED DESCRIPTION

Disclosed herein are techniques for transferring a high frequency signal. According to one implementation, a circuit arrangement includes an antenna switch and the antenna switch includes a plurality of ports. The circuit arrangement further includes a bandstop filter that is coupled to at least one port of the antenna switch. The bandstop filter is configured to attenuate a disturbing frequency. The circuit arrangement further includes a transistor that is configured to receive a control signal and to switch on the bandstop filter responsive to the control signal.

According to another implementation, a circuit arrangement includes an antenna switch that includes a plurality of ports. The circuit arrangement further includes a bandstop filter that includes an inductance. A first terminal of the inductance is coupled to at least one port of the antenna switch. The circuit arrangement further includes a transistor that is coupled to a second terminal of the inductance. The transistor is configured to receive a control signal and is further configured to switch on the bandstop filter responsive to the control signal.

According to another embodiment, a method is provided for transferring a high frequency signal. A high frequency signal is received at a port of an antenna switch and the high frequency signal comprises a disturbing frequency. Further, a control signal is received and a bandstop filter is switched on in response to the control signal. Further, the disturbing frequency is attenuated.

Implementations as illustrated and described hereby may allow for a transfer of high frequency signals with an improved performance and with improved electrical characteristics. Furthermore, undisturbed and reliable transmission of signals of various high frequency bands may be achieved.

The techniques described herein may be implemented in a number of ways. Examples and context are provided below with reference to the included figures and ongoing discussion.

Exemplary Devices

Figure 1:
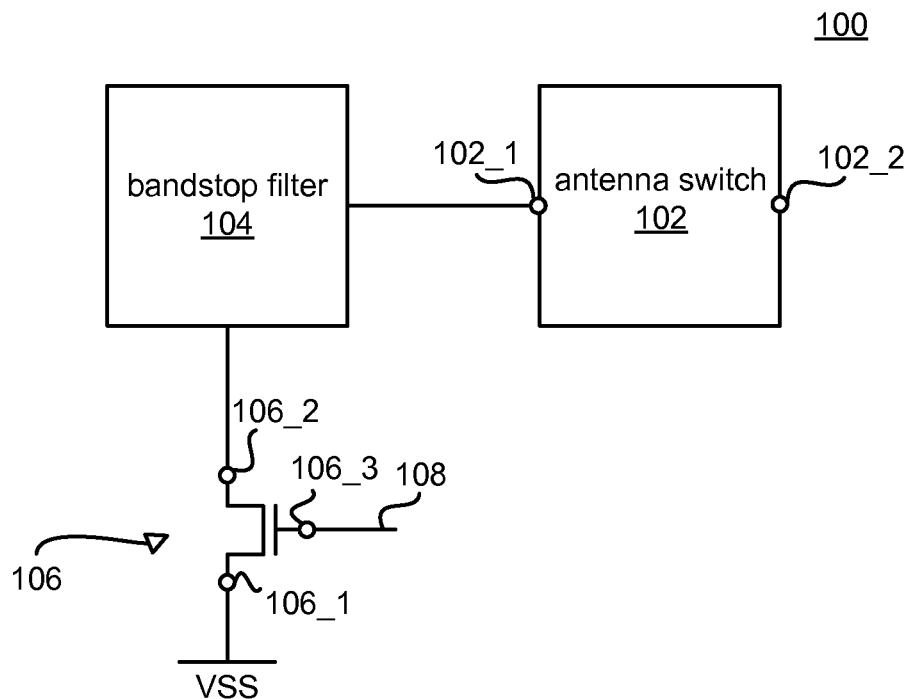
FIG. 1 shows a schematic diagram of an exemplary circuit arrangement that includes an antenna switch, a bandstop filter and a transistor.

FIG. 1 shows a schematic diagram of an exemplary circuit arrangement 100 that includes an antenna switch 102, a bandstop filter 104 and a transistor 106. The antenna switch 102 includes a plurality of ports 102_1 and 102_2 and the bandstop filter 104 is coupled to at least one port 102_1 of the plurality of ports 102_1 and 102_2 of the antenna switch 102. The bandstop filter 104 is configured to attenuate a disturbing frequency. The transistor 106 is configured to receive a control signal 108. The transistor 106 is coupled to the bandstop filter 104 and is configured to switch on the bandstop filter 104 responsive to the control signal 108.

As illustrated in FIG. 1, the transistor 106 may be implemented as an N-type MOS (NMOS) transistor. A source terminal 106_1 of the transistor 106 may be coupled to a reference ground potential VSS, a drain terminal 106_2 of the transistor 106 may be coupled to the bandstop filter 104, and a gate terminal 106_3 of the transistor 106 may be coupled to the control signal 108. During operation, the NMOS transistor 106 may be turned on by a logic '1' value at the gate terminal 106_3 provided via the control signal 108. In this case, the transistor 106 may switch on the bandstop filter 104, and the bandstop filter 104 may attenuate a disturbing frequency of a signal to a very low level. The signal may be received from or provided to the port 102_1 of the antenna switch 102. By attenuating a disturbing frequency of a signal that may be transferred within the circuit arrangement 100, the performance and the electrical characteristics of the circuit arrangement 100 may be improved.

In the circuit arrangement 100 as illustrated in FIG. 1, the bandstop filter 104 may be activated selectively. As described earlier herein, the bandstop filter 104 may be switched on when a logic '1' value is provided at the gate terminal 106_3 of the transistor 106. Correspondingly, the bandstop filter 104 may be switched off when a logic '0' value is provided at the gate terminal 106_3 of the transistor 106. For example, the bandstop filter 104 may be activated for a certain period of time and/or for certain modes of operation of the circuit arrangement 100. That means, the bandstop filter 104 may affect the operation of the circuit arrangement 100 temporally. For other periods of time and/or other modes of operation, the operation of the circuit arrangement 100 may not be affected by the bandstop filter 104. The bandstop filter 104 may also be referred to as an adaptive filter, a notch filter or a trap filter.

Figure 2:
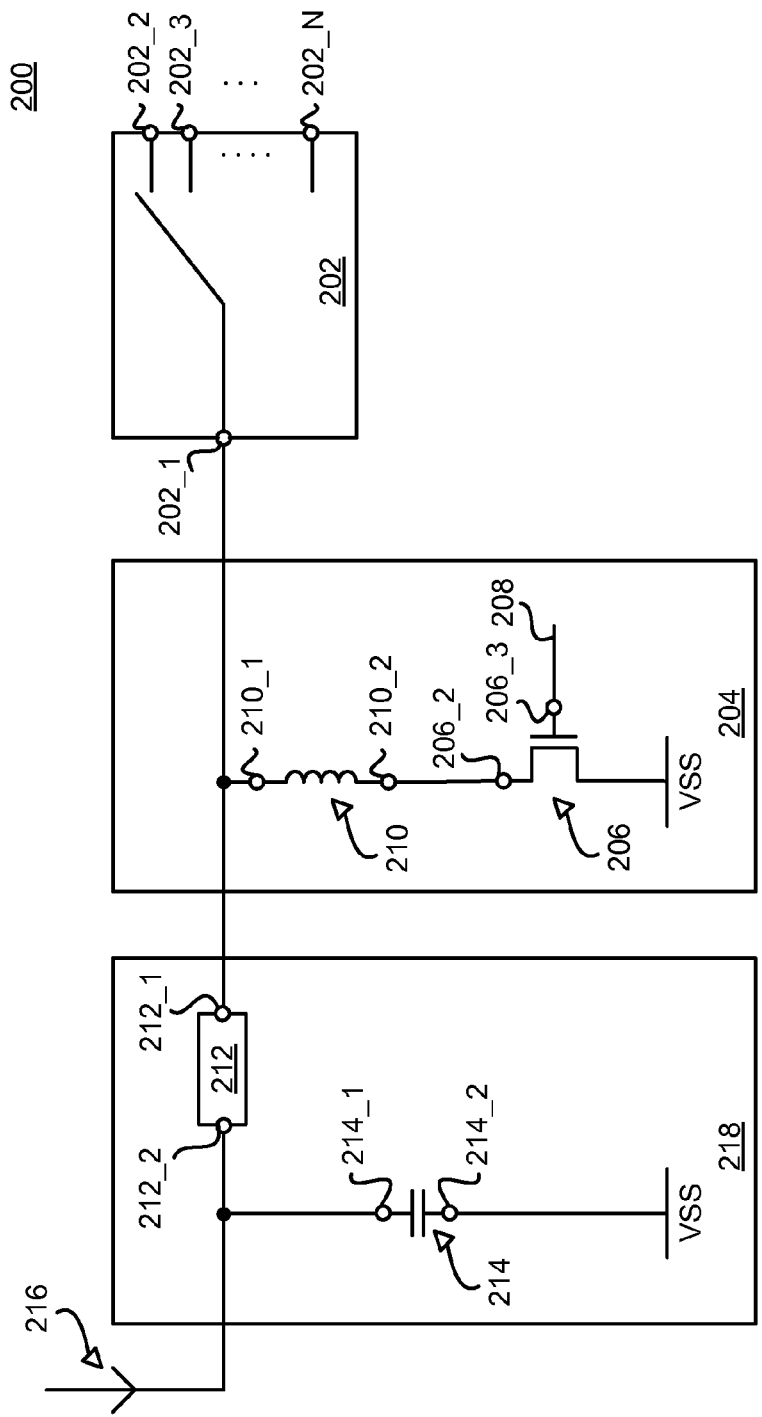
FIG. 2 shows a schematic circuit diagram of a further exemplary circuit arrangement that includes an antenna switch and a bandstop filter.

FIG. 2 shows a schematic circuit diagram of a further exemplary circuit arrangement 200 that includes an antenna switch 202 and a bandstop filter 204. The bandstop filter 204 includes a transistor 206 and an inductor 210. The circuit arrangement 200 further includes a matching element 212, a capacitor 214 and an antenna 216.

The antenna switch 202 may be implemented as a single-pole N-throw (SPNT) switch and may have multiband capabilities. The antenna switch 202 may include a plurality of ports 202_1, 202_2, 202_3 . . . 202_N. Port 202_1 of the antenna switch 202 may be a single pole port and ports 202_2, 202_3 . . . 202_N of the antenna switch 202 may be throw ports. Each of the throw ports 202_2, 202_3 . . . 202_N may be coupled to one of a transmitter, a receiver or a transceiver. The transmitter, the receiver or the transceiver may be coupled to the common antenna 216 via the antenna switch 202 for transmitting and receiving high frequency signals in different high frequency bands. In one implementation, the single-pole port 202_1 may be an output port of the antenna switch 202 and the throw ports 202_2, 202_3 . . . 202_N may be input ports of the antenna switch 202 that may be coupled to multiple transmitters (not illustrated in FIG. 2). Each of the input ports 202_2, 202_3 . . . 202_N and each of the multiple transmitters, respectively, may be assigned to a different high frequency band. During operation, the antenna switch 202 may route a signal received at one of the input ports 202_2, 202_3 . . . 202_N to the output port 202_1. That means, the antenna switch 202 may switch between various high frequency signal paths and, at the same time, between various corresponding high frequency bands.

As illustrated in FIG. 2, a first terminal 212_1 of the matching element 212 is coupled to the output port 202_1 of the antenna switch 202 and a second terminal 212_2 of the matching element 212 is coupled to the antenna 216. The matching element 212 may be implemented for impedance matching in order to reduce or avoid reflections of signals transferred within the circuit arrangement 200. For example, the matching element 212 may be dimensioned to match an impedance of 50 ohms, which is a common value for a source and a load impedance in high frequency systems. The matching element 212 may include, e.g., a metal line and/or an inductance (not illustrated in FIG. 2).

The second terminal 212_2 of the matching element 212 may further be coupled to a first terminal 214_1 of the capacitor 214. A second terminal 214_2 of the capacitor 214 may be coupled to a reference ground potential VSS. The matching element 212 together with the capacitor 214 may represent a low-pass filter 218. The low pass filter 218 may filter out high frequency signals that are transferred from the antenna 216 to the antenna switch 202 and vice versa. The value of the capacitor 214 may be selected in a well known manner to create a low pass characteristic of the low pass filter 218 for passing signals within and below a desired frequency band. For example, the low pass filter 218 may filter out a harmonic generated by the circuit arrangement 200 and/or by nay devices coupled to the ports 202_2, 202_3 . . . 202_N.

As illustrated in FIG. 2, the first terminal 212_1 of the matching element 212 may further be coupled to a first terminal 210_1 of the inductor 210 and a second terminal 210_2 of the inductor 210 may be coupled to a drain terminal 206_2 of the transistor 206. That is, the inductor 210 and the transistor 206 may be coupled in series and may form the bandstop filter 204 that may be coupled to the output port 202_1 of the antenna switch 202. The bandstop filter 204 may be dimensioned so as to attenuate a disturbing frequency of a signal that is provided at the output port 202_1 of the antenna switch 202. The disturbing frequency may be a higher order harmonic that is generated by the antenna switch 202 due to nonlinearities of the antenna switch 202. Additionally or alternatively, the disturbing frequency may be induced by a circuit element, e.g. a power amplifier, that is coupled to one of the input ports 202_2, 202_3 . . . 202_N of the antenna switch 202 (not illustrated in FIG. 2).

As illustrated and described in connection with FIG. 1 earlier herein, the bandstop filter 204 may be enabled selectively based on a control signal 208. In contrast to the implementation as illustrated and described in connection with FIG. 1, during operation, in a first case, the bandstop filter 204 may be switched on when a logic '0' value is provided at a gate terminal 206_3 of the transistor 206 via the control signal 208. In this case, the transistor 206 is turned off and the inductor 210 is floating. A parasitic capacitance of the transistor 206 together with the inductor 210 may form the bandstop filter 204, i.e., the bandstop filter 204 may comprise an LC-resonator. The parasitic capacitance of the transistor 206 may be composed of a parasitic capacitance between the source and the gate of the transistor 206 and a parasitic capacitance between the drain and the gate of the transistor 206 when the transistor 206 is turned off.

During operation, in a second case, the transistor 206 may be turned on when a logic '1' value is provided at the gate terminal 206_3 of the transistor 206 via the control signal 208. When the transistor 206 is turned on, no parasitic capacitance may be provided by the transistor 206 and the bandstop filter 204 may be de-activated. Since the transistor 206 is conducting, the second terminal 210_2 of the inductor 210 is coupled to the reference ground potential VSS via the transistor 206. Further, the output port 202_1 of the antenna switch 202 may be coupled to the reference ground potential VSS via the inductor 201 and the transistor 206. In this case, the inductor 210 may provide electrostatic discharge (ESD) protection to the circuit arrangement 200. When an ESD event occurs, e.g., via the antenna 216, the inductor 210 may short an ESD voltage to the reference ground potential VSS.

It is to be noted, that also in the first case the circuit arrangement 200 may be protected against an ESD event because the transistor 206 may provide ESD protection to the circuit arrangement 200 when the transistor 206 is turned off. The size of the transistor 206 may be in a range of several millimeters and a breakdown of the transistor 206 may be used as ESD protection. No additional ESD protection device may be required in the circuit arrangement 200.

Generally, the transistor 206 and the inductor 210 as illustrated in FIG. 2 may have several functions. First, as described earlier herein, the transistor 206 may activate the bandstop filter 204 on the basis of a logic value provided by the control signal 208. Second, as described earlier herein, the transistor 206 and the inductor 210 may be part of the bandstop filter 204. Third, as described earlier herein, the transistor 206 and the inductor 210 may provide ESD protection to the circuit arrangement 200. Fourth, the transistor 206 and the inductor 210 may effect an adaptation of a frequency response of the circuit arrangement 200 when the transistor 206 is turned on and when the inductor 210 is coupled to the reference ground potential VSS via the transistor 206. More specific, the inductor 210 may be part of a high-pass filter that may affect the frequency response of the circuit arrangement 200. The circuit arrangement 200 as illustrated and described in connection with FIG. 2 may allow for an area-efficient and ESD robust implementation of a bandstop filter 204 that may be coupled selectively to the antenna switch 202.

Referring to FIG. 2, the antenna switch 202 may switch between a plurality of signal paths and each signal path may be dedicated to a corresponding high frequency band. As described earlier herein, the bandstop filter 204 may be activated selectively. For example, the bandstop filter 204 may be activated for one or several of the plurality of high frequency bands and may be de-activated for other ones of the plurality of high frequency bands. In other words, just one or several of the signals that are routed from one or several of the input ports 202_2, 202_3 . . . 202_N of the antenna switch 202 to the antenna 216 may be filtered by the bandstop filter 204. Other signals that are routed from the input ports 202_2, 202_3 . . . 202_N of the antenna switch 202 to the antenna 216 may not be affected by the bandstop filter 204. Therefore, just the high frequency bands of interest may be affected by the bandstop filter 024 and all other high frequency bands may remain unaffected.

During operation, in one mode of operation, the antenna switch 202 may route a signal in a band 13 that may have a carrier frequency of 786.5 MHz to the output port 202_1. As described earlier herein, the antenna switch 202 may generate a higher order harmonic and, e.g., a second harmonic in the band 13 signal may be 1,573 GHz. This frequency is very close to a GPS band of 1,575 GHz. Generally, as a strength of signals in the GPS band may be low, a signal in the GPS band may be susceptible to disturbances from other high frequency bands. More specifically, the signal in the GPS band may be disturbed by the second harmonic in a band 13 signal.

Referring to FIG. 2, the second harmonic in the band 13 signal may be trapped out by the bandstop filter 204. The bandstop filter 204 may be dimensioned in a way that its stopband includes 1573 MHz and every time the antenna switch 202 routes a band 13 signal, the bandstop filter 204 may be activated to filter out the second harmonic in the band 13 signal. That is, the second harmonic generated by the antenna switch 202 may be suppressed by the bandstop filter 204. Consequently, a transfer of a signal in the GPS band may not be disturbed by the band 13 signal. The circuit arrangement 200 may allow for an undisturbed and reliable transmission of signals of various high frequency bands.

The band 13 and the GPS band are just one example for interacting signals. Another example may be a signal of a GSM 900 band, which may disturb a transfer of a signal of a GSM 1800 band.

Figure 3:
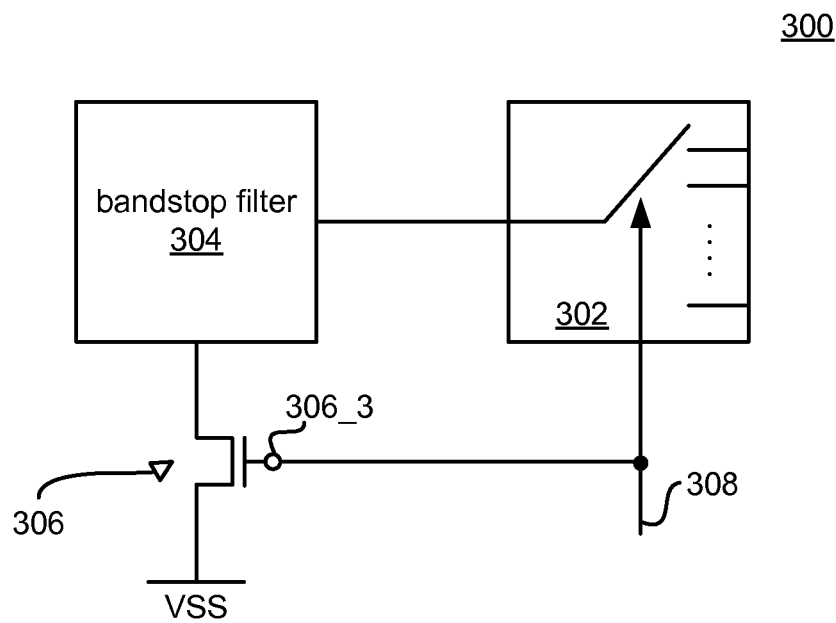
FIG. 3 shows a schematic circuit diagram of a further exemplary circuit arrangement that includes an antenna switch, a bandstop filter and a transistor.

FIG. 3 shows a schematic circuit diagram of a further exemplary circuit arrangement 300 that includes an antenna switch 302, a bandstop filter 304 and a transistor 306. The antenna switch 302, the bandstop filter 304 and the transistor 306 may be coupled to each other in a similar manner as in the circuit arrangement 100, as illustrated and described in connection with FIG. 1.

In contrast to FIG. 1, a control signal 308 is not only provided to a gate terminal 306_3 of the transistor 306 but also to the antenna switch 302. A signal path and a high frequency band, respectively, may be switched within the antenna switch 302 responsive to the control signal 308. By providing the control signal 308 to both, the transistor 306 and the antenna switch 302, the bandstop filter 304 may be switched on/off and concurrently a switching of a signal path within the antenna switch 302 may be performed.

For example, the antenna switch 302 may switch to a band 13 signal path responsive to the control signal 308 and simultaneously the transistor 306 may activate the bandstop filter 304 responsive to the control signal 308 to filter out a disturbing, higher order harmonic generated, e.g., by the antenna switch 302. The control signal 308 may be provided to the circuit arrangement 300, e.g., by a decoder, a fuse, a memory unit, a processor, by software or any other logic unit (not illustrated in FIG. 3).

By providing the control signal 308 to both, the transistor 306 and the antenna switch 302, the logic effort for controlling the transistor 306 and the antenna switch 302 may be kept low. Furthermore, it is possible to ensure that the bandstop filter 304 is activated in due time for one or more high frequency bands within the antenna switch 302, for which filtering is required.

Figure 4:
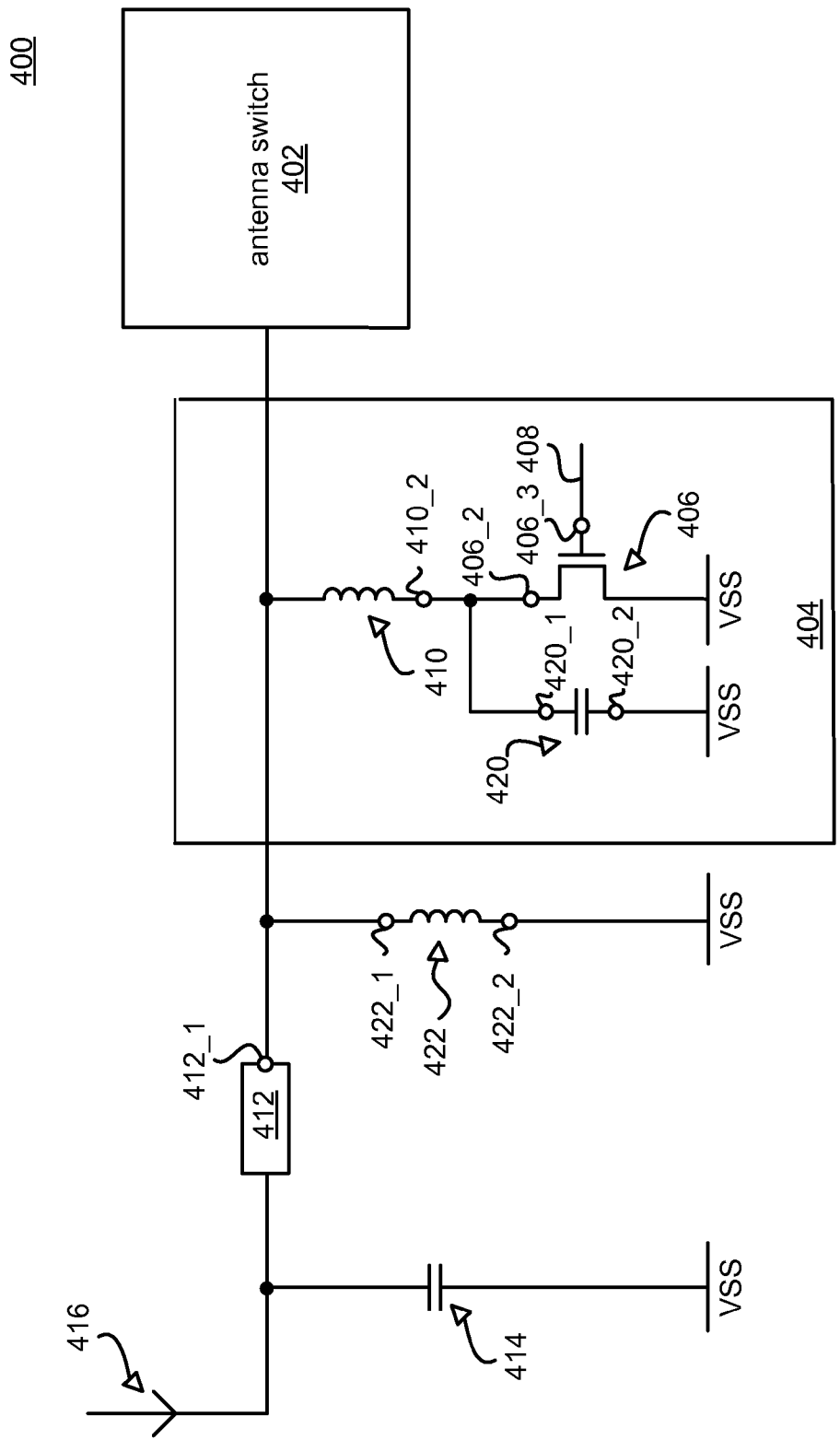
FIG. 4 shows a schematic circuit diagram of a further exemplary circuit arrangement that includes an antenna switch, a transistor, an inductor, a matching element, a capacitor and an antenna.

FIG. 4 shows a schematic circuit diagram of a further exemplary circuit arrangement 400 that includes an antenna switch 402, a transistor 406, an inductor 410, a matching element 412, a capacitor 414 and an antenna 416. In addition to the circuit arrangement 200, as illustrated and described in connection with FIG. 2, the circuit arrangement 400 includes a further capacitor 420 and a further inductor 422.

A first terminal 422_1 of the further inductor 422 may be coupled to a first terminal 412_1 of the matching element 412. A second terminal 422_2 of the further inductor 422 may be coupled to a reference ground potential VSS. The further inductor 422 may provide ESD protection to the circuit arrangement 400. When an ESD voltage is applied to the circuit arrangement 400, e.g., via the antenna 416, the further inductor 422 may short the ESD voltage to the reference ground potential VSS. The further inductor 422 may provide ESD protection to the circuit arrangement 400 independent of the mode of operation of the circuit arrangement 400. Furthermore, the further inductor 422 may improve the ESD robustness of the circuit arrangement 400 and the circuit arrangement 400 may withstand an ESD current in a range of several Amperes.

A first terminal 420_1 of the further capacitor 420 may be coupled to a second terminal 410_2 of the inductor 410 and to a drain terminal 406_2 of the transistor 406. A second terminal 420_2 of the further capacitor 420 may be coupled to the reference ground potential VSS. That is, the further capacitor 420 and the transistor 406 may be coupled in parallel. The further capacitor 420 and the inductor 410 may be discrete devices and may be part of a bandstop filter 404, similar to the bandstop filters 104, 204 and 304, as illustrated and described in connection with FIGS. 1-3. The further capacitor 420 may improve the quality factor (Q-factor) of the bandstop filter 404. Similarly as described in connection with FIG. 2, in a first case, the bandstop filter may be switched on when a logic '0' value is provided at a gate terminal 406_3 of the transistor 406 via the control signal 408. In this case, the transistor 406 is turned off and a parasitic capacitance of the transistor 406 together with the inductor 410 and the further capacitor 420 may form the bandstop filter 404. In a second case, the transistor 406 may be turned on when a logic '0' is provided at the gate terminal 406_3 and the bandstop filter 404 may be de-activated.

FIGS. 5A-5E show schematic circuit diagrams of capacitances that may be implemented in one of the bandstop filters 104, 204, 304 and 404, as illustrated and described in connection with FIGS. 1-4. The capacitances of FIG. 5A-5E may be formed by several capacitive devices that may be coupled in series and/or in parallel. The capacitances of FIG. 5A-5E may be tunable by switching on or switching off one or several transistors.

FIG. 5A shows a schematic circuit diagram of a capacitance that includes a plurality of discrete capacitive devices 520_1, 520_2 . . . 520_M that are coupled in series and a plurality of transistors 506_1, 506_2 . . . 506_M that are coupled in series. Each of the capacitive devices 520_1, 520_2 . . . 520_M is coupled in parallel to one of the transistors 506_1, 506_2 . . . 506_M. For example, the capacitive device 520_1 is coupled in parallel to the transistor 506_1, the capacitive device 520_2 is coupled in parallel to the transistor 506_2 and the capacitive device 520_M is coupled in parallel to the transistor 506_M. The capacitive value of the capacitance of FIG. 5A may be tuned by turning on or turning off one or several of the transistors 506_1, 506_2 . . . 506_M. By turning on one of the transistors 506_1, 506_2 . . . 506_M, the capacitive device that is coupled in parallel to the one transistor may be bypassed.

The capacitive value of each of the capacitive devices 520_1, 520_2 . . . 520_M may be C. In one example, none of the transistors 506_1, 506_2 . . . 506_M may be turned on. In this case, none of the capacitive devices 520_1, 520_2 . . . 520_M may be bypassed and the overall capacitive value of the capacitance of FIG. 5A may be formed by the three capacitive devices 520_1, 520_2 . . . 520_M coupled in series. Thus, the overall capacitive value of the capacitance of FIG. 5A may be C/3. In another example, the transistors 506_1 and 506_2 may be turned on and the capacitive devices 520_1 and 520_2 may be bypassed. Thus, the overall capacitive value of the capacitance of FIG. 5A may be formed by the capacitive device 520_M and the overall capacitive value may be C.

FIG. 5B shows a schematic circuit diagram of a capacitance that includes a plurality of discrete capacitive devices 520_1, 520_2 . . . 520_M that are coupled in parallel and a plurality of transistors 506_1, 506_2 . . . 506_M. Each of the capacitive devices 520_1, 520_2 . . . 520_M is coupled in series to one of the transistors 506_1, 506_2 . . . 506_M. For example, the capacitive device 520_1 is coupled in series to the transistor 506_1, the capacitive device 520_2 is coupled in series to the transistor 506_2 and the capacitive device 520_M is coupled in series to the transistor 506_M. The capacitive value of the capacitance of FIG. 5B may be tuned by switching on or switching off one or several of the transistors 506_1, 506_2 . . . 506_M. By switching on one of the transistors 506_1, 506_2 . . . 506_M, the capacitive device that is coupled in series to the one transistor may be enabled.

The capacitive value of each of the discrete capacitive devices 520_1, 520_2 . . . 520_M may be C. In one example, the transistors 506_1 and 506_2 may be switched on and the capacitive devices 520_1 and 520_2 may be enabled. Thus, the overall capacitive value of the capacitance of FIG. 5A may be formed by the capacitive device 520_1 coupled in parallel to the capacitive device 520_2 and the overall capacitive value may be 2° C.

The discrete capacitive devices 520_1, 520_2 . . . 520_M of FIG. 5A and FIG. 5B are described as having the same capacitive value C. Alternatively, the capacitive value of the capacitive devices 520_1, 520_2 . . . 520_M may be different. For example, the capacitive value of the capacitive device 520_1 may be C, the capacitive value of the capacitive device 520_2 may be 2° C. and the capacitive value of the capacitive device 520_M may be M*C. Generally, the capacitance may be switchable in predetermined, different weightings.

FIG. 5C shows a schematic circuit diagram of a capacitance that is similar to the capacitance as illustrated and described in connection with FIG. 5B. The capacitance of FIG. 5C includes a plurality of capacitive devices 520_1, 520_2 . . . 520_M that are coupled in parallel and a plurality of transistors 506_1, 506_2 . . . 506_M. By turning on or turning off one or several of the transistors 506_1, 506_2 . . . 506_M the capacitive value of the capacitance of FIG. 5C may be tuned. In contrast to the implementation as illustrated and described in connection with FIG. 5B, the capacitive devices 520_1, 520_2 . . . 520_M are formed by transistors whose gate terminals are coupled to a negative voltage, e.g., to −3V. That is, the transistors are permanently turned off and the capacitive devices 520_1, 520_2 . . . 520_M are formed by parasitic capacitances of the transistors. The implementation as illustrated in FIG. 5C may allow for an improved ESD resistance.

The capacitive value of one of the capacitive devices 520_1, 520_2 . . . 520_M may be defined by a width to length (W/L) ratio of the transistors. In one implementation, all transistors may have the same W/L ratio. In another implementation, the W/L ration of the transistors may differ. For example, the transistor 520_1 may have a W/L ratio of $W_1/L_1$, the transistor 520_2 may have a W/L ratio of $W_2/L_2$ and the transistor 520_M may have a W/L ratio of $W_M/L_M$. For example, the transistor may include large devices to allow for an area-optimized implementation.

FIG. 5D shows a schematic circuit diagram of a capacitance that includes a plurality of transistors 506_1, 506_2 . . . 506_M that are coupled in series i.e., the transistors 506_1, 506_2 . . . 506_M are stacked. FIG. 5E shows a schematic circuit diagram of a capacitance that includes a plurality of transistors 506_1, 506_2 . . . 506_M that are coupled in parallel. By turning on or turning off one or several of the transistors 506_1, 506_2 . . . 506_M the capacitive value of the capacitance of FIG. 5D may be tuned. In addition, the transistors 506_1, 506_2 . . . 506_M may form capacitive devices. As described in connection with FIG. 2 earlier herein, when one of the transistors 506_1, 506_2 . . . 506_M is turned off a parasitic capacitance of the one transistor may be composed of a parasitic capacitance between the source and the gate and a parasitic capacitance between the drain and the gate of the one transistor. To summarize, in FIG. 5D and FIG. 5E, the transistors 506_1, 506_2 . . . 506_M may form capacitive devices and additionally, the transistors 506_1, 506_2 . . . 506_M may be used to tune the capacitive value of the overall capacitance. The implementations as illustrated in FIGS. 5D+5E may allow for an ESD robust and an area-efficient design.

The implementations as illustrated and described in connection with FIGS. 5A-5E may be combined. For example, in one implementation, the embodiment as illustrated and described in connection with FIG. 5D may be combined with the embodiment as illustrated and described in connection with FIG. 5E. That is, a capacitance may be formed by a plurality of transistors that are coupled in parallel and a plurality of transistors that are coupled in series. In another implementation, the embodiment as illustrated and described in connection with FIG. 5A may be combined with the embodiment as illustrated and described in connection with FIG. 5B.

As described in connection with FIGS. 5A-5E earlier herein, a capacitive value of a capacitance may be tunable and the tunable capacitance may be implemented in one of bandstop filters as illustrated and described in connection with FIGS. 1-4. That is, the bandstop filters of FIGS. 1-4 may be adaptive filters that may be tunable, e.g., a stopband of the bandstop filters may be tunable. In one implementation, the stopband of a bandstop filter may be tuned in accordance with a mode of operation of a circuit arrangement that includes the bandstop filter. For example, in one mode of operation, the stopband of a bandstop filter may be tuned in accordance with a second harmonic that is generated by an antenna switch. In another implementation, the stopband of a bandstop filter may be tuned in order to compensate for variations of process parameters that occurred during production of a circuit arrangement that includes the bandstop filter.

The implementations as illustrated and described in connection with FIGS. 1-4 and FIGS. 5A-5E are shown as including NMOS transistors. In other implementations, different types of transistors may be implemented, like e.g. PMOS transistors, FET- or bipolar transistors.

The implementations as illustrated and described in connection with FIGS. 1-4 and FIGS. 5A-5E may be designed and implemented in different technologies. For example, at least one of CMOS technology, Silicon-On-Insulator (SOI), Silicon-On-Sapphire (SOS), Gallium-Arsenid (GaAs), bipolar technology, high-electron mobility transistor (HEMT), micro-electro-mechanical systems (MEMS) or PIN-diodes may be implemented.

The arrangements as illustrated and described in connection with FIGS. 1-4 and FIGS. 5A-5E may be implemented on a same semiconductor device, i.e., they may be implemented on a same silicon substrate. Alternatively, the implementation of the arrangements may be spread on several semiconductor devices and/or may be implemented as discrete devices. For example, referring to FIG. 2, the antenna switch 202 may be a separate semiconductor device that may include the transistor 206. The inductor 210, the matching element 212, the capacitor 214 and the antenna 216 may not be integrated in this separate semiconductor device.

Several of the implementations as illustrated and described in connection with FIGS. 1-4 are shown as having a bandstop filter that is coupled to an output port of an antenna switch. Alternatively, the bandstop filter may be coupled to an input port of the antenna switch. For example, the bandstop filter may filter out a disturbing frequency that is generated by a power amplifier that is coupled to the input port of the antenna switch.

Features of the implementations as illustrated and described in connection with FIGS. 1-4 and FIGS. 5A-5E may be combined. For example, features of the implementation of FIG. 2 may be combined with features of the implementation of FIG. 3. The circuit arrangement 200 of FIG. 2 may be extended according to the implementation of FIG. 3 in a way that the control signal 208 may be provided to both, the gate terminal 206_2 of the transistor 206 and to the antenna switch 202. That is, the bandstop filter 204 may be switched on/off and concurrently a switching of a signal path within the antenna switch 202 may be performed.

In one implementation, the circuit arrangements as illustrated and described earlier herein may be included in a front-end module of a portable radio device. The front-end module may be used in wireless telecommunication devices, such as mobile phones, personal digital assistants or wireless interface cards of computers.

Figure 6:
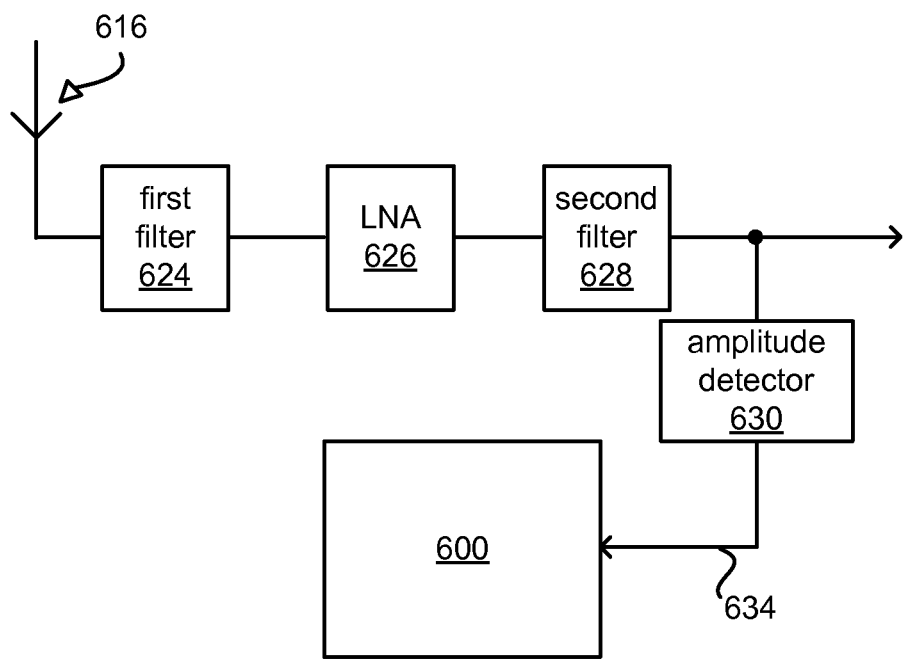
FIG. 6 shows a system that includes a circuit arrangement, an antenna, a first filter, a low-noise amplifier, a second filter and an amplitude detector.

FIG. 6 shows a system 632 that includes a circuit arrangement 600, an antenna 616, a first filter 624, a low-noise amplifier (LNA) 626, a second filter 628 and an amplitude detector 630. The first filter 624 may be referred to as an antenna filter. The system 632 may include a GPS receiver and the circuit arrangement 600 may include one of the implementations as illustrated and described in connection with FIGS. 1-4 and FIGS. 5A-5E earlier herein.

A signal may be received via the antenna 616 and the signal may be passed through the first filter 624, the LNA 626 and the second filter 628. The LNA 626 may increase the signal's power level for a particular frequency band to a level appropriate for processing by subsequent blocks. The first and second filters 624 and 628 may perform additional filtering or processing. The second filter 628 may be coupled to the amplitude detector 630 that may evaluate an amplitude of a disturbing frequency of a signal received from the second filter 628. The disturbing frequency may include a higher order harmonic, an intermodulation component, a jammer and/or a distortion. A control signal 634 may be provided by the amplitude detector 630 in accordance with an amplitude of the disturbing frequency. The control signal 634 may be provided to the circuit arrangement 600 and a capacitance of a bandstop filter of the circuit arrangement 600 may be tuned adaptively in accordance with the control signal 634. The tuning of the capacitance may be performed similar as illustrated and described in connection with FIG. 5A-5E. The tuning may be repeated several times and the tuning of the capacitance may be completed when the amplitude of the disturbing frequency of the signal received via the antenna 616 may reach a minimum value. Then, the bandstop filter of the circuit arrangement 600 may be configured to filter out or attenuate the disturbing frequency. Generally, the system 632 may allow for a transfer of high frequency signals with improved performance and no or low disturbances.

Exemplary Method

Figure 7:
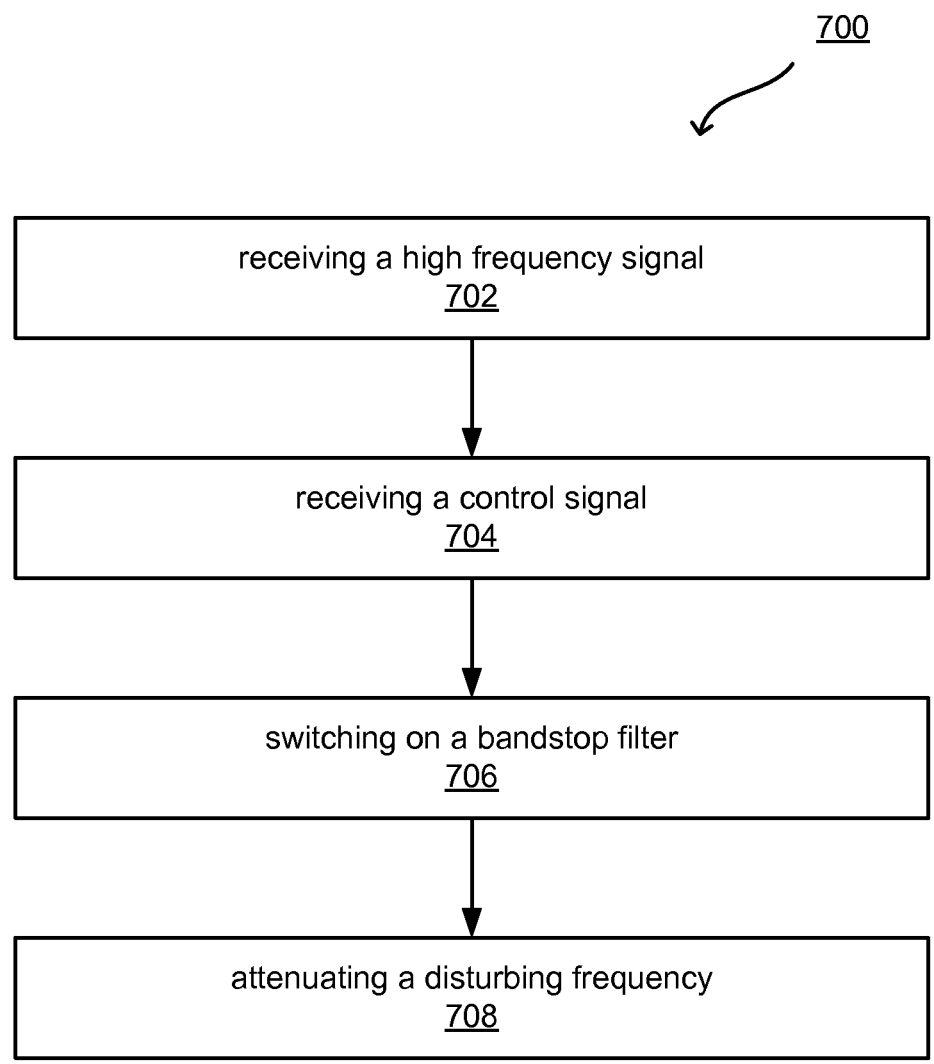
FIG. 7 illustrates a flow diagram that includes a number of operations transferring a high frequency signal.

FIG. 7 illustrates a flow diagram 700 that includes a number of operations transferring a high frequency signal. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-6 and the subject matter thereof. The procedure described in connection with FIG. 7 may be realized utilizing the previously described implementations.

Referring to FIG. 7, at block 702, a high frequency signal is received at a port of an antenna switch. The high frequency signal comprises a disturbing frequency. The port may be an input and/or output port of the antenna switch. In one implementation, the disturbing frequency may be a higher order harmonic that is generated by the antenna switch due to nonlinearities of the antenna switch. In another implementation, the disturbing frequency may be induced by a circuit element, e.g. a power amplifier, that is coupled to one of the input ports of the antenna switch. In another implementation, the disturbing frequency may be received via an antenna and transmitted to the antenna switch that is coupled to the antenna.

At block 704, a control signal is received.

At block 706, a bandstop filter is switched on in response to the control signal. The bandstop filter may be enabled selectively based on the control signal. For example, the bandstop filter may be activated for a certain period of time and/or for certain modes of operation.

At block 708, the disturbing frequency is attenuated. The bandstop filter may be configured to attenuate the disturbing frequency to a very low level.

In one implementation, the disturbing frequency is a higher order harmonic generated by the antenna switch. The higher order harmonic may be generated due to nonlinearities of the antenna switch.

In a further implementation, a high frequency path is switched within the antenna switch in response to the control signal. The antenna switch may have multiband capabilities and may route high frequency signals in different high frequency bands.

In a further implementation, a stopband of the bandstop filter is tuned. The bandstop filter may be dimensioned in a way that its stopband includes the disturbing frequency.

The operations as illustrated and described in connection with the flow diagram 700 of FIG. 7 may allow for an undisturbed and reliable transmission of signals of various high frequency bands.

CONCLUSION

For the purposes of this disclosure and the claims that follow, the term "coupled" has been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. A circuit arrangement, comprising:
an antenna switch comprising a plurality of ports;
a bandstop filter coupled to at least one of the plurality of ports of the antenna switch, the bandstop filter configured to attenuate a disturbing frequency; and
a transistor configured to receive a control signal and configured to switch on the bandstop filter responsive to the control signal,
wherein the control signal is configured to control a switching of a high frequency path within the antenna switch.

2. The circuit arrangement of claim 1, wherein the at least one of the plurality of ports is an output port of the antenna switch coupled to an antenna and wherein the disturbing frequency is a higher order harmonic generated by the antenna switch.

3. The circuit arrangement of claim 1, wherein the bandstop filter comprises a resonator.

4. The circuit arrangement of claim 3, wherein the resonator comprises an inductance, a first terminal of the inductance coupled to the at least one of the plurality of ports of the antenna switch and a second terminal of the inductance coupled to the transistor.

5. The circuit arrangement of claim 4, wherein the resonator further comprises a capacitance and wherein the capacitance and the inductance are coupled in series.

6. The circuit arrangement of claim 5, wherein the capacitance comprises a parasitic capacitance of the transistor.

7. The circuit arrangement of claim 5, wherein the capacitance comprises a discrete capacitor and wherein the discrete capacitor and the transistor are coupled in parallel.

8. The circuit arrangement of claim 1, wherein the bandstop filter is configured to be tunable.

9. The circuit arrangement of claim 8, wherein a stopband of the bandstop filter is tunable.

10. The circuit arrangement of claim 1, wherein the transistor is further configured to provide ESD protection for the antenna switch.

11. A circuit arrangement, comprising:
an antenna switch comprising a plurality of ports;
a bandstop filter comprising an inductance, a first terminal of the inductance coupled to at least one of the plurality of ports of the antenna switch; and
a transistor coupled to a second terminal of the inductance, the transistor configured to receive a control signal and configured to switch on the bandstop filter responsive to the control signal,
wherein the control signal is configured to control a switching of a high frequency path within the antenna switch.

12. The circuit arrangement of claim 11, wherein the transistor is further configured to provide ESD protection for the antenna switch.

13. The circuit arrangement of claim 11, wherein the bandstop filter comprises a resonator including the inductance.

14. The circuit arrangement of claim 13, wherein the resonator further comprises a capacitance and wherein the capacitance and the inductance are coupled in series.

15. The circuit arrangement of claim 14, wherein the capacitance comprises a parasitic capacitance of the transistor.

16. The circuit arrangement of claim 14, wherein the capacitance comprises a discrete capacitor and wherein the discrete capacitor and the transistor are coupled in parallel.

17. The circuit arrangement of claim 11, wherein the bandstop filter is configured to attenuate a disturbing frequency.

18. The circuit arrangement of claim 17, wherein the at least one of the plurality of ports is an output port of the antenna switch coupled to an antenna and wherein the disturbing frequency is a higher order harmonic generated by the antenna switch.

19. The circuit arrangement of claim 11, wherein a stopband of the bandstop filter is configured to be tunable.

20. A method of transferring a high frequency signal, comprising:
receiving a high frequency signal comprising a disturbing frequency at a port of an antenna switch;
receiving a control signal at a terminal of a transistor;
switching on a bandstop filter in response to the control signal;
attenuating the disturbing frequency by the bandstop filter; and
switching a high frequency path within the antenna switch in response to the control signal.

21. The method of claim 20, wherein the disturbing frequency is a higher order harmonic generated by the antenna switch.

22. The method of claim 20, further comprising: tuning a stopband of the bandstop filter.

* * * * *